United States Patent
Ruckdeschel

(10) Patent No.: US 6,545,352 B1
(45) Date of Patent: Apr. 8, 2003

(54) ASSEMBLY FOR MOUNTING POWER SEMICONDUCTIVE MODULES TO HEAT DISSIPATORS

(75) Inventor: Thomas W. Ruckdeschel, Apex, NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 10/077,318

(22) Filed: Feb. 15, 2002

(51) Int. Cl.$^7$ .............................................. H01L 23/48
(52) U.S. Cl. ........................ 257/718; 257/706; 361/688; 361/718
(58) Field of Search ................................ 257/704, 706, 257/707, 712, 713, 717, 718, 719, 720; 361/688, 692, 701, 704, 709, 711, 712, 713, 718, 719; 174/253; 29/837

(56) References Cited

U.S. PATENT DOCUMENTS

| | | | |
|---|---|---|---|
| 3,946,276 A | 3/1976 | Braun et al. ................ 317/100 |
| 4,707,726 A | 11/1987 | Tinder ......................... 357/81 |
| 4,748,495 A | 5/1988 | Kucharek ..................... 357/82 |
| 4,887,147 A | 12/1989 | Friedman ..................... 357/74 |
| 5,283,467 A | 2/1994 | Goeschel et al. ............ 257/718 |
| 5,309,979 A | 5/1994 | Brauer ....................... 165/80.2 |
| 5,321,582 A | 6/1994 | Casperson .................. 361/713 |
| 5,369,879 A | 12/1994 | Goeschel et al. ............ 29/837 |
| 5,548,090 A | 8/1996 | Harris ........................ 174/252 |
| 5,640,304 A | 6/1997 | Hellinga et al. ............ 361/707 |
| 5,734,556 A | 3/1998 | Saneinejad et al. ......... 361/719 |
| 5,771,155 A | 6/1998 | Cook .......................... 361/710 |
| 5,812,376 A | 9/1998 | Mach et al. ................. 361/719 |
| 5,973,922 A | 10/1999 | Kamphuis ................... 361/704 |
| 6,208,518 B1 | 3/2001 | Lee ............................ 361/704 |
| 6,266,244 B1 | 7/2001 | Guthrie ...................... 361/704 |
| 6,307,155 B1 | 10/2001 | Permuy ..................... 174/52.1 |
| 6,418,022 B1 * | 7/2002 | Chen .......................... 361/704 |
| 6,441,480 B1 * | 8/2002 | Takeuchi et al. ............ 257/706 |
| 2001/0002160 A1 | 5/2001 | Bookhardt et al. ......... 361/704 |
| 2001/0028552 A1 | 10/2001 | Letourneau ................. 361/704 |
| 2001/0030037 A1 | 10/2001 | Hellbruck et al. .......... 165/80.3 |

* cited by examiner

Primary Examiner—Kamand Cuneo
Assistant Examiner—Lourdes Cruz
(74) Attorney, Agent, or Firm—Moore & Van Allen PLLC; Matthew W. Witsil

(57) ABSTRACT

Methods and apparatus for mounting a semiconductor to a heat sink. A clamp is provided comprising a spring beam mounted to a clamp body, wherein the body restricts the spring beam ends and the spring beam has a convex curvature relative to an adjacent power semiconductive module. The portion of the spring beam near its apex contacts the module, applying force to bias a heat-transmitting surface of the module against a heat sink. When temperature increases, the spring beam expands to add additional clamping force to the module. Further embodiments provide making the spring beam from a material having a high coefficient of thermal expansion and the clamp body from a material having a low coefficient of thermal expansion, further increasing the force that may be applied by the spring beam with increases in temperature. The spring beam may comprise layers of different materials to increase the applied force.

15 Claims, 5 Drawing Sheets

ASSEMBLY FOR MOUNTING POWER SEMICONDUCTIVE MODULES TO HEAT DISSIPATORS

BACKGROUND OF THE INVENTION

Many semiconductor devices generate heat that, if not dissipated, can raise the temperature of the device sufficiently to damage it, causing abnormal operation or complete failure. It is therefore common practice to attach the semiconductor device to some form of heat dissipator, which functions to absorb heat from the device and transfers the heat to the surrounding atmosphere.

Typically, a semiconductor device is furnished with a heat-transmitting surface that can be attached by a mechanical fastener, such as a machine screw, to a heat dissipator. One commonly used heat dissipator is a heat sink. For convenience, the term "heat sink" is referenced herein, though it should be understood that other types of heat dissipators, such as heat pipes, are equally applicable. The assembled semiconductor device and heat dissipator are then attached to a support, such as a printed circuit board. Electrical leads emanating from the semiconductor device are attached, usually by soldering, to connection pads located on the printed circuit board. The mechanical fastener attaches the heat transmitting surface to the heat sink, causing sufficient contact pressure to be created between the heat transmitting surface of the semiconductor device and the heat sink for there to be good heat conduction. The mechanical fasteners are installed through holes in flanges on the power semiconductor devices and are then threaded into holes in the heat sinks.

In many applications, power semiconductive devices experience significant thermal cycling. Such uses include, for example, the consumption of power in cellular base stations. Power amplifiers, one type of power semiconductive device or module, are used in the radio units (TRXs) of cellular base stations. Repeated heating and cooling of the mounting assembly, in combination with different thermal expansion characteristics of the individual components, can cause loosening of screws, stress relaxation of small screw threads, reduction in contact pressure due to thermal expansion of fastening devices such as screws, or a combination thereof. Accordingly, the force exerted by screws can decrease over time and as this occurs, the cooling effectiveness of the assembly is reduced. Thereafter, thermal cycles increase in magnitude, and can eventually lead to overheating and failure of the power semiconductive device, which is one of the primary field failure modes of TRXs. Mechanical fasteners can require time-consuming assembly procedures and tight geometric tolerances, particularly if several devices are to be mounted in sequence. Also, since the semiconductor must be electrically insulated from the heat dissipator, the fastener used to attach the semiconductive device mounting tab or flange in many uses must be insulated.

Alternative arrangements to mechanical fasteners for mounting heat-generating electrical components to heat sinks include heat sinks that resiliently grip the semiconductor device. This technique eliminates the need for mechanical fasteners, such as screws, which require accurate alignment and time consuming assembly methods. Many of these alternative arrangements require modifications to the structural design of the heat sink in order to be able to accommodate, for example, resilient clips or springs that couple the electrical device and the heat sink. Clip-on heat sinks are, in general, limited because of their low thermal mass that can be effectively coupled to the component. Springs are also used in some arrangements, but in general these arrangements are negatively affected by thermal cycling, thermal expansion, or both.

BRIEF SUMMARY OF THE INVENTION

The present invention is directed to a mounting assembly for a heat-generating component, such as a power semiconductive module, using a clamping load. A clamp body is provided that may be fastened to a cover that protects the printed circuit board and module, or to another relatively fixed surface spaced from the module. The clamp body has two spaced, substantially parallel, raised edges extending away from the cover toward the module. A clamp spring is a beam that is compressed so that its ends abut the raised edges of the clamp body, and the installed spring has a generally convex curvature relative to the position of the module. At the apex of the spring's curvature, which occurs at the area along the spring farthest from the clamp body, the spring contacts and applies force to the module on the surface of the module opposite the module's heat-conducting surface. This force is transferred to the clamp body through the two ends of the spring. When the assembly experiences thermal expansion, the expansion of the spring causes the clamping force to increase.

In further embodiments, the clamp body is made of a material with a low coefficient of thermal expansion, and the clamp spring is made of a material with a relatively high coefficient of thermal expansion. Such a differential may provide greater relative expansion of the spring and accordingly a higher clamping force.

Additional various embodiments provide different configurations of the clamp body, including inward extensions on the raised edges, a two-part body, and outward extensions that appropriately space the clamp body from walls attached to the cover. Specific applications include but are not limited to the use of the present invention to mount a power amplifier in a radio unit (TRX) of a base station. A clamp, including the clamp body and clamp spring, may also be used in other embodiments and in other applications. The present invention also includes embodiments for mounting a plurality of modules using a clamping force. The spring may be constructed with more than one layer of material, with differing materials having different coefficients of expansion, altering the performance of the spring.

A method of assembling the module mount is provided. The module is placed in contact with a heat sink, and a clamp body is fastened to a cover. A clamp spring is inserted in the body so that the spring ends abut raised edges of the body, causing the spring to have a convex curvature relative to the module. The apex of the spring is brought into contact with the module, and the cover is fastened in position such that the spring biases the module against the heat sink, with the force exerted by the spring increasing with an increase in temperature.

Another method is provided for biasing the module against the heat sink. A spring beam has two ends that each abut a respective substantially fixed points to make a spring of convex curvature relative to the module, and the central apex portion of the spring is in contact with and applies force to the module. The force exerted increases with an increase in temperature to provide additional clamping force.

DETAILED DESCRIPTION OF THE INVENTION

The present invention may be embodied in any application requiring the mounting of a component having thermal energy that is desirable to be transferred away from the component to a cooling device. Specific embodiments disclosed herein include the mounting of heat-generating electronic components, such as semiconductors, to heat dissipators.

One or more embodiments referred to herein describe the present invention in the context of mobile terminal base stations, wherein power semiconductive modules, or more specifically power amplifiers, are found. As used herein, the term "mobile terminal" may include a cellular radiotelephone with or without a multi-line display, a Personal Communications System (PCS) terminal that may combine a cellular radiotelephone with data processing, facsimile and data communications capabilities; a PDA that can include a radiotelephone, pager, Internet/intranet access, Web browser, organizer, calendar and/or a global positioning system (GPS) receiver; and a conventional laptop and/or palmtop receiver or other appliance that includes a radiotelephone transceiver. Mobile terminals may also be referred to as "pervasive computing" devices.

It should be understood that not every feature of the receiving system described is necessary to implement the invention as claimed in any particular one of the appended claims. Various elements of mounting arrangements are described to fully enable the invention. It should also be understood that throughout this disclosure, where a process or method is shown or described, the steps of the method may be performed in any order or simultaneously, unless it is clear from the context that one step depends on another being performed first.

In the Figures herein, unique features receive unique numbers, while features that are the same in more than one drawing receive the same numbers throughout. Where a feature is modified between figures, a letter is added or changed after the feature number to distinguish that feature from a similar feature in a previous figure.

The invention includes the application of a spring beam held in a compressed position by an appurtenant body to provide a clamping force when the spring is urged against an electrical component such as a power semiconductive module. The electrical component is urged against a heat dissipator, and as the temperature of the spring increases, the force exerted by the spring increases. An increase in clamping force results in lower thermal impedance between the electrical component and the heat dissipator, resulting in higher conductive heat transfer. In general, the invention also facilitates placement of fastening devices such as screws away from the heat source, reducing some of the effects of thermal cycling.

Figure 1:
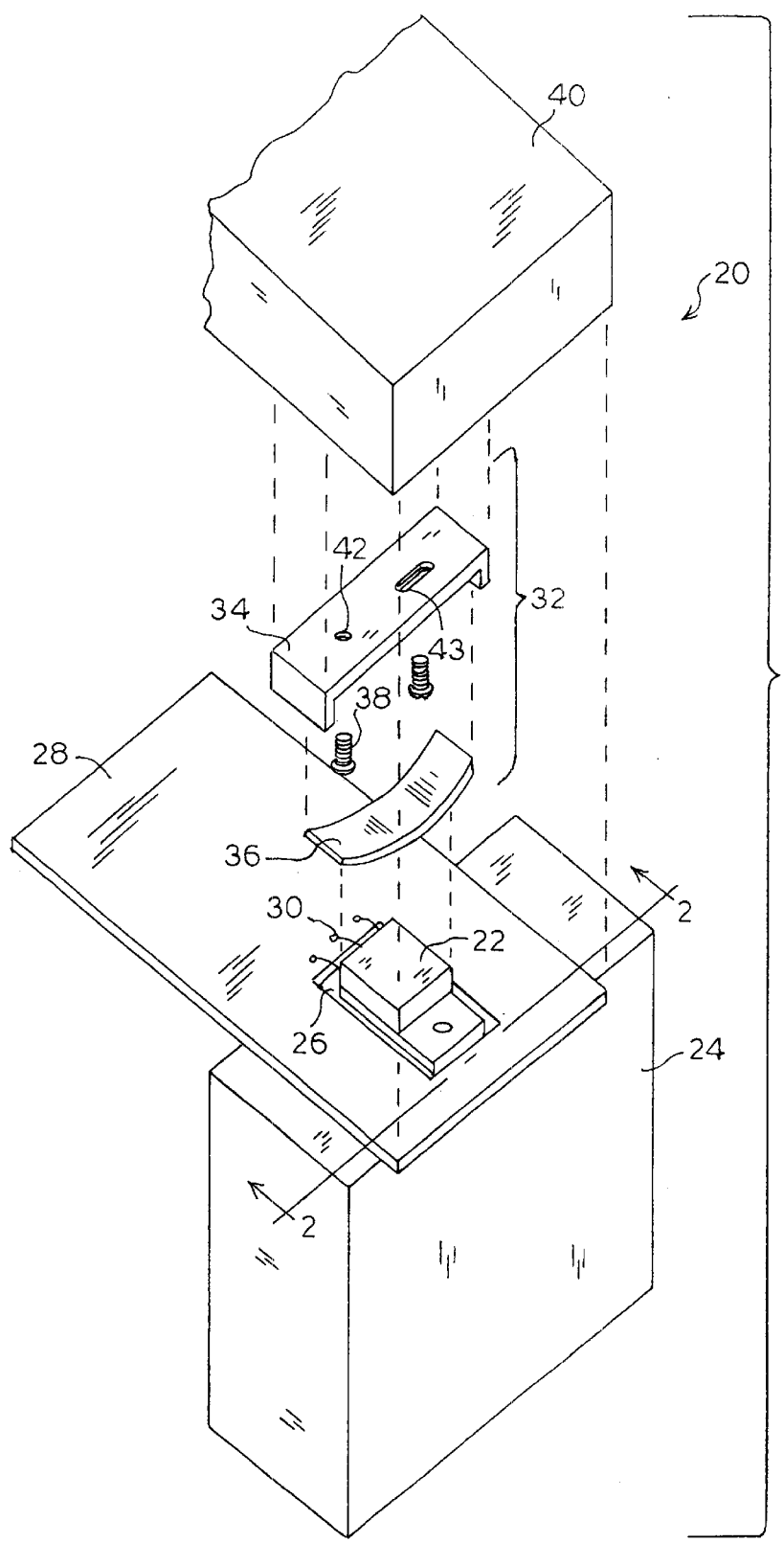
FIG. 1 is an exploded perspective view of one embodiment of the present invention.

FIG. 1 illustrates various components of one embodiment of the mounting assembly 20. A power amplifier 22 is mounted on a heat sink 24 through an opening 26 in a printed circuit board 28. Known heat sinks in electronics applications include heat spreaders, often having cooling fins, and thermosyphons. The heat sink may be cooled with forced flow of liquid coolant, as is well known in the art. Electrical connection leads 30 from the amplifier 22 are electrically and mechanically connected to the printed circuit board 28, commonly done by soldering to connection pads that are electrically connected to other devices on the board 28, not shown.

A clamp 32 according to the present invention is used to mechanically bias the amplifier 22 against the heat sink 24. The clamp 32 comprises a body 34, a spring beam 36, and fastening means 38, illustrated in FIG. 1 as screws. The body 34 is fastened to a cover 40, which in the case of a mobile terminal base station may be, for example, a TRX cover casting. Holes 42, 43 are provided through the body 34 to facilitate assembly with the screws 38 and allow movement of the body 34 relative to the cover 40. One hole 43 is shown as a slot, and is oriented to allow the body 34 and cover 40 to expand different amount with out "stretching" the part with a lower relative coefficient of thermal expansion, or unduly stressing either part. In general, only one of the holes 42, 43 needs to be slotted. If the body 34 and cover 40 are made of the same material, neither hole 42, 43 needs to be slotted.

In FIG. 1, the embodiment of the mounting assembly 20 is not assembled. For clarity, the spring 36 is shown to be curved, which is the spring's assembled shape, but it may be flat prior to assembly. The mounting assembly 20 of FIG. 1 is illustrated in its assembled configuration in FIG. 2. The body 34 has a central portion 44 and two raised edges 46. The ends of the spring 36 abut and apply force to the raised edges 46 of the body 44. An apex 48 is formed along the curve of the spring 36 at the point distal from the body 34, and the spring 36 has a convex curvature relative to the position of the amplifier 22. As shown, the heat sink 24 optionally may have a recessed area 50 to receive the amplifier 22, and the illustrated heat sink 24 has a main portion 52 for spreading heat and fins 54 for cooling. A gasket 56 is usually disposed between the cover 40 and the circuit board 28. The gasket 56 may comprise conductive gasketing used to ground the cover to the circuit board 28 for electromagnetic interference protection, or alternatively may be conventionally electrically nonconductive material, as suitable depending on the application.

Figure 2:
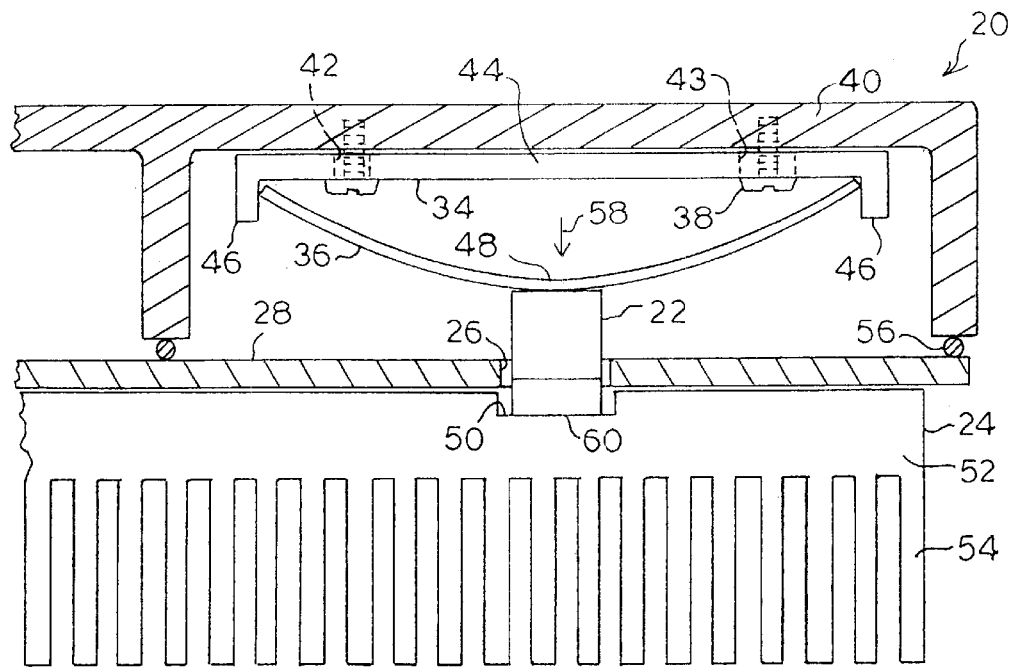
FIG. 2 is a cross-section view of the assembled embodiment along the line 2—2 of FIG. 1.

One mounting method may begin by assembling the amplifier 22, printed circuit board 28, and heat sink 24 as shown in FIGS. 1 and 2. The body 34 is fastened to the cover 40 using the screws 38 as shown or other well-known mechanical fastening means. The spring 36 is deflected for insertion of the spring's ends into the body 34. The cover 40 is then brought into close proximity with the circuit board 28, and is fastened using conventional means (not shown) to be relatively fixed in relation to the amplifier 22, printed circuit board 28, and heat sink 24. As the cover 40 is brought into assembled position, but before being in the final and closest position to the circuit board 28, the spring 36 contacts the amplifier 22. As the cover 40 is urged closer to the circuit board 28, the spring 36 exerts a force 58 at its apex 48 on the amplifier 22, "pre-loading" the clamp prior to any thermal cycling. The force 58 is transferred to the body 34.

As the temperature of the mounting assembly 20 increases and expansion of the components occurs, the geometry of the spring 36 and the end points that are substantially fixed, or restrained, by the body 34 causes the force 58 exerted by the spring 36 to increase, applying additional clamping force on the amplifier 22. Accordingly, the contact at the mating, heat-conducting surface 60 of the amplifier 22 and heat sink 24 is improved. Where the terms "fixed" or "substantially fixed" are used herein to refer to the relative position of components or parts of components, it is intended the such parts are not normally expected to change in position relative to each other, except as the result of thermal cycling.

The body 34 and spring 36 of the present invention may be made of any material that is known by one of ordinary skill in the art to have adequate mechanical strength properties and to be suitable for thermal cycling of the particular application. If the body 34 and spring 36 are made of the same material, or different materials having like thermal expansion characteristics, the force 58 exerted by the spring will increase with an increase in temperature. This is based solely on the geometry of the components, because the length along the spring 36 is greater than the distance between the spring's endpoints as measured along the body 34. Accordingly, the total linear expansion of the spring 36 will be greater than the expansion of the body 34, and because the ends of the spring can only move as much as the body 34 expands, the additional length of the spring 36 causes the force 58 to increase.

To maximize the addition of force applied to the amplifier 22 during periods of high temperature, the body 34 may be made from a material having a very low coefficient of thermal expansion, such as fiberglass or carbon/epoxy composite, and also having a relatively high elastic modulus and yield strength to be mechanically suitable. The spring 36, on the other hand, may be made from a material having a very high coefficient of thermal expansion, such as steel spring stock material, and also have a very high elastic modulus and yield strength. The other components may be as conventionally known and used.

Approximate coefficients of thermal expansion at 20° C. for selected materials are listed for reference in Table 1 below.

TABLE 1

| Material | Linear expansion per degree C. × 10<sup>−6</sup> | Linear expansion per degree F. × 10<sup>−6</sup> |
| --- | --- | --- |
| Aluminum | 24 | 13 |
| Brass | 19 | 11 |
| Copper | 17 | 9.4 |
| Iron | 12 | 6.7 |
| Steel (carbon) | 13 | 7.2 |
| Stainless Steel | 17 | 9.6 |
| Platinum | 9 | 5 |
| Tungsten | 4.3 | 2.4 |
| Gold | 14 | 7.8 |
| Silver | 18 | 10 |
| Polyethylene | 100 | 56 |
| Polyethylene - 30% glass fiber | 48 | 27 |
| Polystyrene | 70 | 39 |
| Epoxy | 55 | 22 |
| 6,6 Nylon | 80 | 45 |
| 6,6 Nylon - 33% glass fiber | 20 | 11 |
| Glass, ordinary | 9 | 5 |
| Glass, pyrex | 4 | 2.2 |
| Quartz, fused | 0.59 | 0.33 |

The scope of the invention is not, however, intended to be limited by the materials listed herein, but may be carried out using any materials that allow the construction and operation of the described mount assemblies. The dimensions of the body 34 and the spring 36, as well as their materials and associated mechanical characteristics, are based on the particular application as may be determined by one of ordinary skill in the art.

Figure 3:
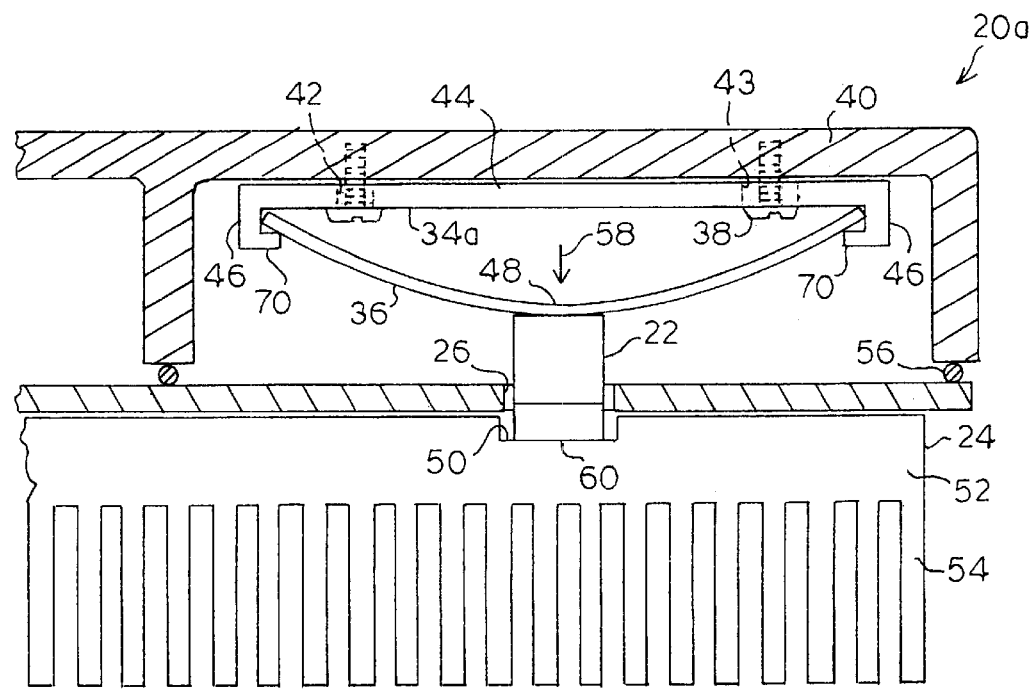
FIGS. 3, 4, and 5 are each cross-section views of additional assembled embodiments of the present invention.

FIG. 3 illustrates a mounting assembly 20a, wherein the raised edges 46 of the body 34a have an inwardly extending portion 70. The inwardly extending portions 70 form U-shaped edges for receiving the ends of the spring 36 and provide additional protection against displacement of the spring 36 from the body 34a.

Figure 4:
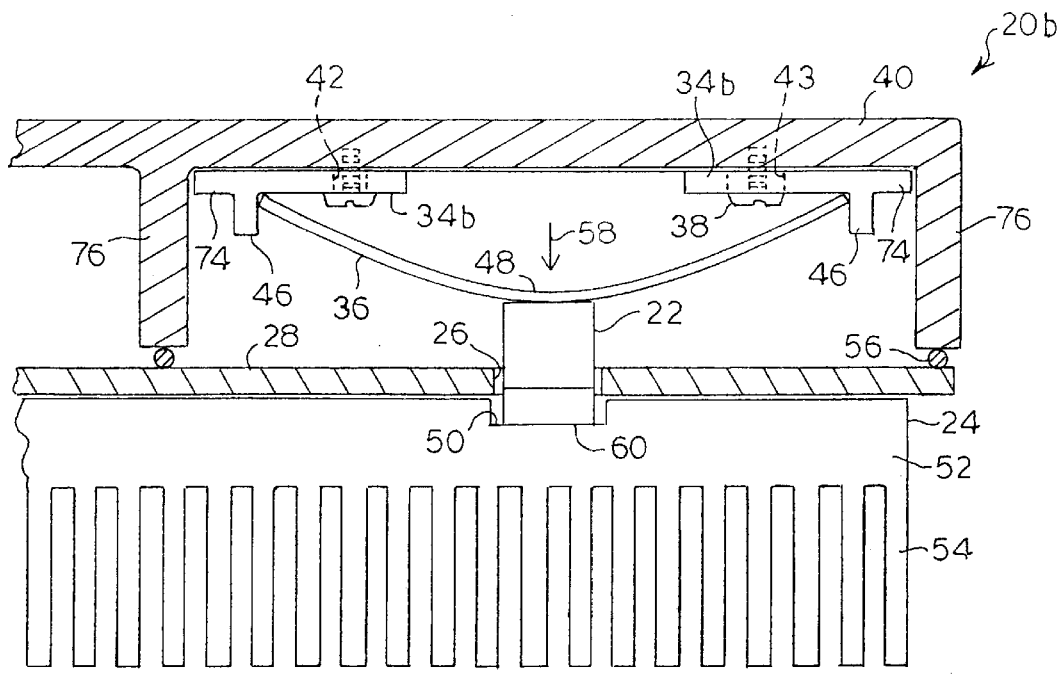

In the mounting assembly 20b illustrated in FIG. 4, the body is provided in two parallel body segments 34b. Spacers 74 are provided as part of the body segments 34b to provide proper alignment relative to cover 40 walls 76. In one embodiment, a TRX cover casting includes an integral clamp body, eliminating the need for a separate clamp body 34, 34a, 34b. Such a cover may be plastic with an integrally molded clamp. For some TRX and other applications, such a plastic cover should be metallized for effective electromagnetic interference protection.

Figure 5:
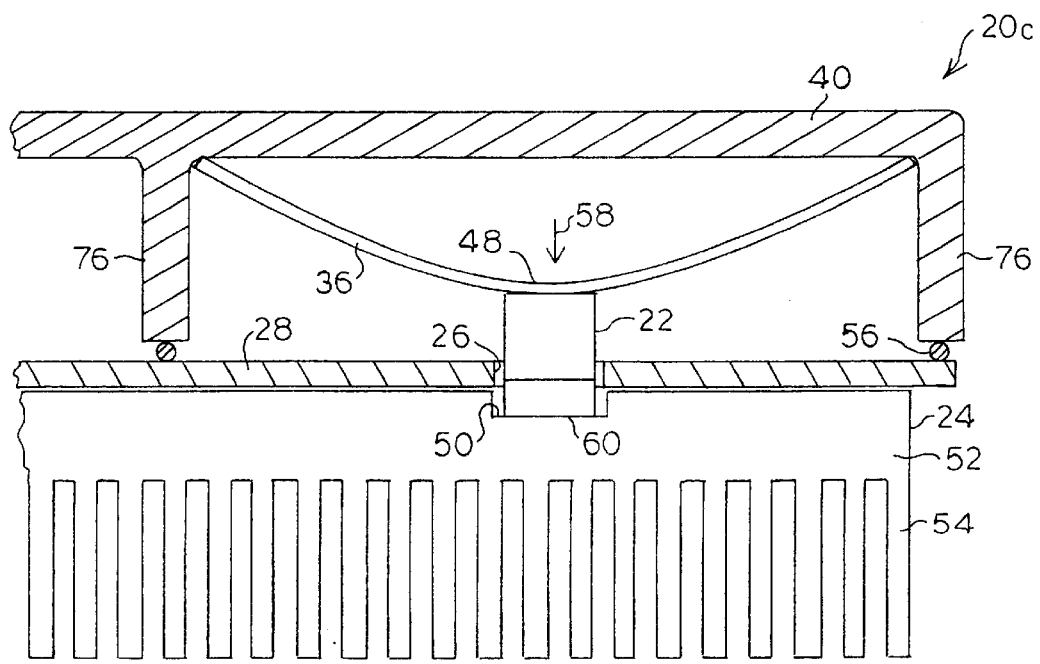

The mounting assembly 20c shown in FIG. 5 provides that the cover 40 serve as the clamp body. The embodiment of FIG. 5, however, does not require that portions like the body 34b (FIG. 4) be provided, as the cover 40 is sized to directly accept the spring 36. In one embodiment the cover 40 is a metallized plastic, which has a lower coefficient of thermal expansion than a frequently used cover material, die-cast aluminum.

Figure 6:
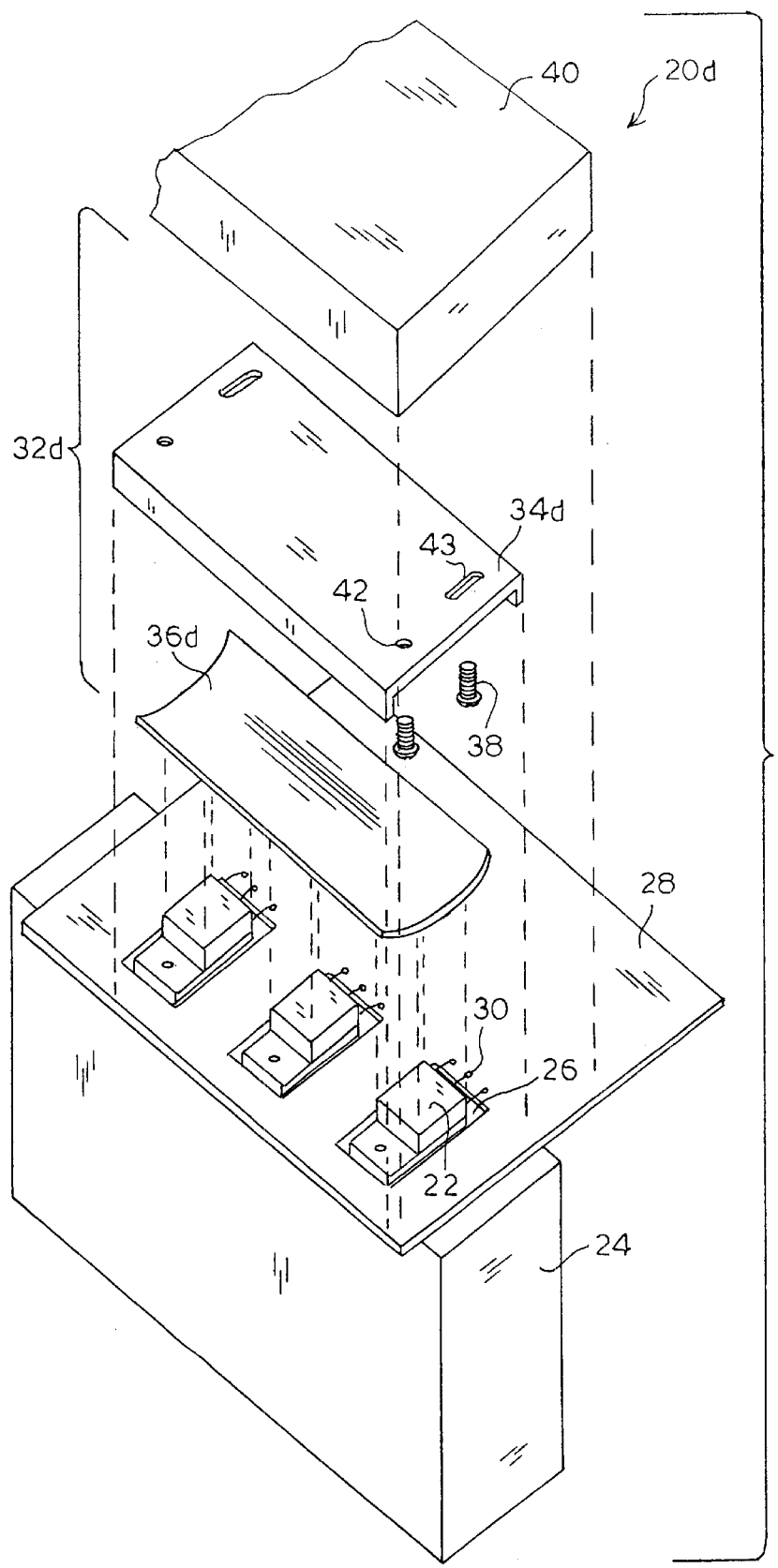
FIG. 6 is an exploded perspective view of another embodiment of the present invention.

FIG. 6 depicts in mounting assembly 20d a plurality of amplifiers 22 to be clamped in place by a single elongated clamp 32d, comprising an elongated body 34d and an elongated spring 36d. The spring 36d is shown as a solid, curved sheet spring, but it may alternatively have portions cut away to form individual spring beams that are, for example, connected along one edge. Independent spring beams may also be used with the body 34d.

Figure 7:
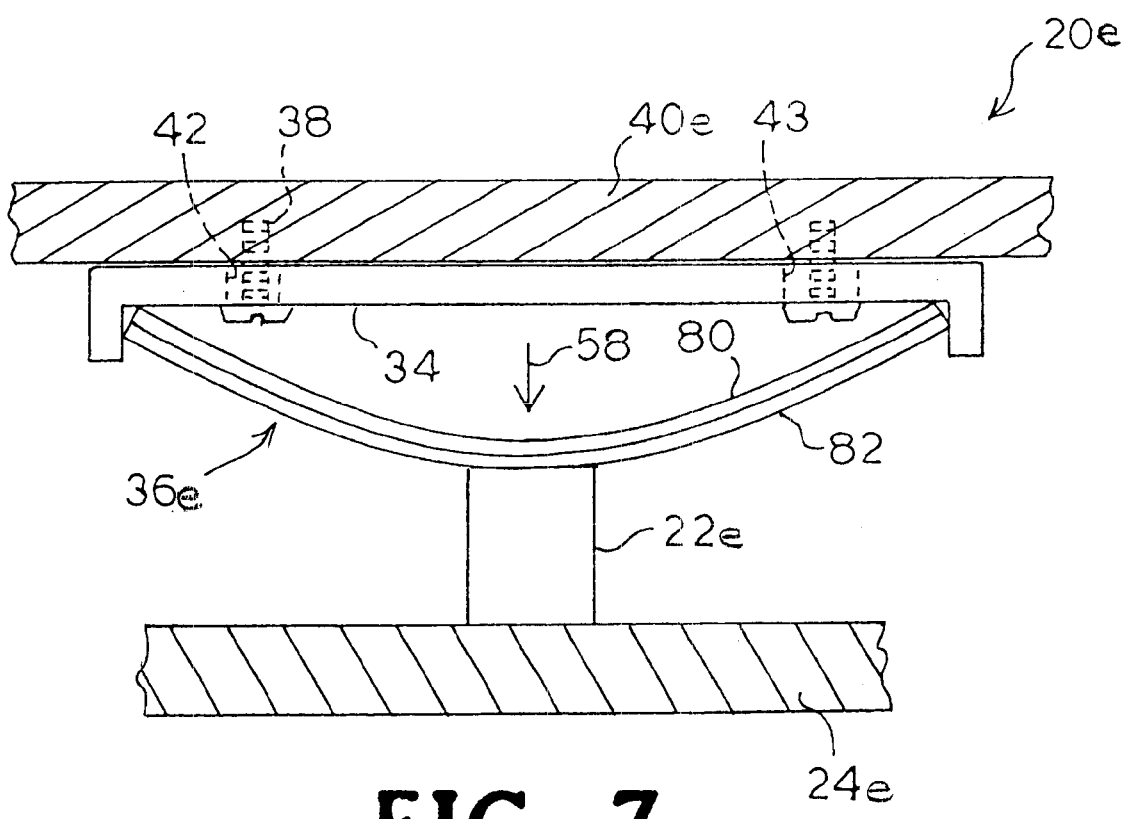
FIG. 7 is a cross-section view of an additional assembled embodiment of the present invention.

An additional embodiment 20e, shown in FIG. 7, uses a spring 36e made from two or more materials arranged in layers 80, 82. Fabrication using materials having different thermal expansion characteristics will alter the behavior of the spring 36a with temperature change. For example, if a material having a relatively low coefficient of thermal expansion is used for the concave-surface forming layer 80 and a material having a higher coefficient of expansion is used for the convex-surface forming layer 82, this combination of materials will increase clamping force per degree of temperature rise as compared to a spring 36 of similar dimensions made of either material. If the materials of both layers 80, 82 are metal, the spring 36e may be referred to as a bimetallic spring. The generic nature of the relatively fixed surface 40e, heat-generating component 22e, and heat dissipator 24e are intended to show that the present invention may be applied in a wide variety of applications where such a clamping force is desirable.

Some embodiments of the invention can be implemented in base station systems (BSS). An exemplary BSS includes a base station controller (BSC) and base station transceivers or base transceiver stations (BTS), each providing service for a single cell through an antenna system. The antenna system can have a single antenna, or multiple antennas. Each BTS includes at least one transmitter as well as one or more receiving systems, requiring mounting of one or more power amplifiers to heat sinks.

Specific embodiments of an invention are described herein. One of ordinary skill in the thermo- and electromechanical arts will quickly recognize that the invention has other applications in other environments. In fact, many embodiments and implementations are possible. For example, the inwardly extending portion 70 of the body 34a shown in FIG. 3 may readily be added to other bodies 34b, 34d as well. Spacers 74 as shown in FIG. 4 may also be added to other bodies 34, 34a, 34d. In addition, the recitation "means for" is intended to evoke a means-plus-function reading of an element in a claim, whereas, any elements that do not specifically use the recitation "means for," are not intended to be read as means-plus-function elements, even if they otherwise include the word "means." The following claims are in no way intended to limit the scope of the invention to the specific embodiments described.

I claim:

1. A mounting assembly for a heat-generating electronic component, the component comprising a designated heat conducting surface and a clamping surface opposite the heat conducting surface, the assembly comprising:

a circuit board with an opening through which a portion of the component is disposed;

a heat dissipator disposed in fixed position relative to the circuit board and comprising a surface in contact with the component heat conducting surface;

a cover comprising an interior surface, the cover interior surface spaced from the component clamping surface;

a clamp body fastened to the cover interior surface, the clamp body comprising two spaced, substantially parallel, raised edges extending away from the cover interior surface; and a clamp spring interposed between the clamp body and the component clamping surface, comprising a beam comprising a concave surface relative to a position central to the raised edges of the clamp body and a convex surface relative to the position of the component, two ends that abut the raised edges of the clamp body, and a central apex distal from the clamp body, wherein at the central apex of the spring, the spring contacts and applies force to the component clamping surface to bias the component against the heat dissipator, and thermal expansion of the clamp spring increases the force exerted on the component clamping surface.

2. The mounting assembly of claim 1 wherein the heat-generating electronic component is a power semiconductive module.

3. The mounting assembly of claim 1 wherein the clamp body is made of a material with a relatively low coefficient of thermal expansion as compared to the clamp spring, and the clamp spring is made of a material with a relatively high coefficient of thermal expansion.

4. The mounting assembly of claim 1 wherein the clamp body raised edges further comprise a portion extending inwardly toward each other from each of the raised edges.

5. The mounting assembly of claim 1 wherein the clamp body further comprises a central planar portion interposed between the raised edges and abutting the cover interior surface.

6. The mounting assembly of claim 1 wherein the clamp body further comprises two spaced pieces each comprising a portion attached to the cover interior surface and one raised edge opposing the edge of the other piece to receive the clamp spring ends.

7. The mounting assembly of claim 1, wherein the clamp spring further comprises at least two layers, one of the at least two layers forming the concave surface of the spring and another layer forming the convex surface of the spring, wherein the at least two layers are made of materials with differing coefficients of thermal expansion.

8. A mounting assembly for a power amplifier in a base station, the amplifier comprising a designated heat conducting surface and a clamping surface opposite the heat conducting surface, the assembly comprising:

a circuit board with an opening through which a portion of the amplifier is disposed;

a heat dissipator disposed in fixed position relative to the circuit board and comprising a surface in contact with the amplifier heat conducting surface;

a cover comprising an interior surface, the cover interior surface spaced from the amplifier clamping surface;

a clamp body fastened to the cover interior surface, the clamp body comprising two spaced, substantially parallel, raised edges extending away from the cover interior surface and a central planar portion, wherein the clamp body is made of a material with a relatively low coefficient of thermal expansion; and a clamp spring interposed between the clamp body and the amplifier clamping surface, comprising a beam comprising a convex curvature relative to the position of the amplifier, two ends that abut the raised edges of the clamp body, and a central apex distal from the clamp body, wherein the clamp spring is made of a material with a relatively high coefficient of thermal expansion as compared to the clamp body, wherein at the central apex of the spring, the spring contacts and applies force to the amplifier clamping surface to bias the amplifier against the heat dissipator, and thermal expansion of the clamp spring increases the force exerted on the amplifier clamping surface.

9. A clamping device for biasing a power semiconductive module against a heat dissipator disposed on an opposite side of the module from the clamping device, where the module is spaced from a relatively fixed surface, the clamping device comprising:

a clamp body fastened to the fixed surface, the clamp body comprising two spaced, substantially parallel, raised edges extending away from the fixed surface; and a clamp spring interposed between the clamp body and the module, comprising a beam comprising a concave surface relative to a position central to the raised edges of the clamp body and a convex surface relative to the position of the module, two ends that abut the raised edges of the clamp body, and a central apex distal from the clamp body, wherein at the central apex of the spring, the spring contacts and applies force to the module to bias the module against the heat dissipator, and thermal expansion of the clamp spring increases the force exerted on the module clamping surface.

10. The clamping device of claim 9 wherein the clamp body is made of a material with a low coefficient of thermal expansion, and the clamp spring is made of a material with a relatively high coefficient of thermal expansion.

11. The clamping device of claim 9 wherein the clamp body raised edges further comprise a portion extending inwardly toward each other from each of the raised edges.

12. The clamping device of claim 9 wherein the clamp body further comprises a central planar portion interposed between the raised edges and abutting the cover interior surface.

13. The clamping device of claim 9 wherein the clamp body further comprises two spaced pieces each comprising a portion attached to the cover interior surface and one raised edge opposing the edge of the other piece to receive the clamp spring ends.

14. The clamping device of claim 9, wherein the clamp spring further comprises at least two layers, one of the at least two layers forming the concave surface of the spring and another layer forming the convex surface of the spring, wherein the at least two layers are made of materials with differing coefficients of thermal expansion.

15. A clamping device for biasing a power amplifier in a base station against a heat dissipator, the amplifier comprising a designated heat conducting surface and a clamping surface opposite the heat conducting surface disposed on an opposite side of the amplifier from the clamping device, where the amplifier is spaced from a relatively fixed surface, the clamping device comprising:

a clamp body fastened to the fixed surface, the clamp body comprising two spaced, substantially parallel, raised edges extending away from the fixed surface, wherein the clamp body is made of a material with a relatively low coefficient of thermal expansion; and a clamp spring interposed between the clamp body and the amplifier, comprising a beam of convex curvature relative to the position of the amplifier, two ends that abut the raised edges of the clamp body, and a central apex distal from the clamp body, wherein the clamp spring is made of a material with a relatively high coefficient of thermal expansion as compared to the clamp body, wherein at the central apex of the spring, the spring contacts and applies force to the module to bias the amplifier against the heat dissipator, and thermal expansion of the clamp spring increases the force exerted on the amplifier clamping surface.

* * * * *